(12) United States Patent
Katkar et al.

(10) Patent No.: US 12,727,514 B2
(45) Date of Patent: Sep. 1, 2026

(54) MULTI-METAL CONTACT STRUCTURE IN MICROELECTRONIC ASSEMBLY

(71) Applicant: ADEIA SEMICONDUCTOR BONDING TECHNOLOGIES INC., San Jose, CA (US)

(72) Inventors: Rajesh Katkar, Milpitas, CA (US); Cyprian Emeka Uzoh, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/393,489

(22) Filed: Dec. 21, 2023

(65) Prior Publication Data

US 2024/0203917 A1 Jun. 20, 2024

Related U.S. Application Data

(60) Continuation of application No. 17/370,576, filed on Jul. 8, 2021, now Pat. No. 11,894,326, which is a (Continued)

(51) Int. Cl.
*H10W 90/00* (2026.01)
*H10W 72/00* (2026.01)
(Continued)

(52) U.S. Cl.
CPC ...... *H10W 90/00* (2026.01); *H10W 72/01935* (2026.01); *H10W 72/01951* (2026.01);
(Continued)

(58) Field of Classification Search
CPC . H01L 2224/80895; H01L 2224/05026; H01L 2224/05557; H01L 2224/05576;
(Continued)

(56) References Cited

U.S. PATENT DOCUMENTS 4,939,568 A 7/1990 Kato et al.
4,998,665 A 3/1991 Hayashi
(Continued)

FOREIGN PATENT DOCUMENTS

CN 1112286 A 11/1995
CN 103531492 A 1/2014
(Continued)

OTHER PUBLICATIONS

Akolkar, R., "Current status and advances in Damascene Electrodeposition," Encyclopedia of Interfacial Chemistry: Surface Science and Electrochemistry, 2017, 8 pages.
(Continued)

*Primary Examiner* — Didarul A Mazumder
(74) *Attorney, Agent, or Firm* — Knobbe, Martens, Olson & Bear, LLP

(57) ABSTRACT

A first conductive material having a first hardness is disposed within a recess or opening of a microelectronic component, in a first preselected pattern, and forms a first portion of an interconnect structure. A second conductive material having a second hardness different from the first hardness is disposed within the recess or opening in a second preselected pattern and forms a second portion of the interconnect structure.

16 Claims, 7 Drawing Sheets

Related U.S. Application Data division of application No. 16/700,802, filed on Dec. 2, 2019, now Pat. No. 11,088,099, which is a continuation of application No. 15/919,894, filed on Mar. 13, 2018, now Pat. No. 10,515,913.

(60) Provisional application No. 62/472,877, filed on Mar. 17, 2017.

(51) Int. Cl.
*H10W 72/90* (2026.01)
*H10W 80/00* (2026.01)

(52) U.S. Cl.
CPC *H10W 72/01953* (2026.01); *H10W 72/01955* (2026.01); *H10W 72/921* (2026.01); *H10W 72/923* (2026.01); *H10W 72/931* (2026.01); *H10W 72/932* (2026.01); *H10W 72/9415* (2026.01); *H10W 72/952* (2026.01); *H10W 80/023* (2026.01); *H10W 80/312* (2026.01); *H10W 90/792* (2026.01)

(58) Field of Classification Search
CPC ....... H01L 2924/14; H01L 2224/08145; H01L 2224/05655; H01L 2224/05647; H01L 2224/03462; H01L 2224/03464; H01L 2224/80345; H01L 2224/05082; H10W 72/921; H10W 72/019; H10W 72/90; H10W 72/932; H10W 72/934; H10W 80/312; H10W 72/01935
USPC .................................. 257/773; 438/618, 666
See application file for complete search history.

(56) References Cited

U.S. PATENT DOCUMENTS 5,087,585 A 2/1992 Hayashi
5,236,118 A 8/1993 Bower et al.
5,322,593 A 6/1994 Hasegawa et al.
5,413,952 A 5/1995 Pages et al.
5,421,953 A 6/1995 Nagakubo et al.
5,442,235 A 8/1995 Parrillo et al.
5,489,804 A 2/1996 Pasch
5,501,003 A 3/1996 Bernstein
5,503,704 A 4/1996 Bower et al.
5,516,727 A 5/1996 Broom
5,610,431 A 3/1997 Martin
5,734,199 A 3/1998 Kawakita et al.
5,753,536 A 5/1998 Sugiyama et al.
5,771,555 A 6/1998 Eda et al.
5,821,692 A 10/1998 Rogers et al.
5,866,942 A 2/1999 Suzuki et al.
5,904,860 A 5/1999 Nagakubo et al.
5,985,739 A 11/1999 Plettner et al.
5,998,808 A 12/1999 Matsushita
6,008,126 A 12/1999 Leedy
6,063,968 A 5/2000 Hubner et al.
6,071,761 A 6/2000 Jacobs
6,080,640 A 6/2000 Gardner et al.
6,097,096 A 8/2000 Gardner et al.
6,117,784 A 9/2000 Uzoh
6,123,825 A 9/2000 Uzoh et al.
6,147,000 A 11/2000 You et al.
6,232,150 B1 5/2001 Lin et al.
6,258,625 B1 7/2001 Brofman et al.
6,259,160 B1 7/2001 Lopatin et al.
6,265,775 B1 7/2001 Seyyedy
6,297,072 B1 10/2001 Tilmans et al.
6,306,750 B1 * 10/2001 Huang ................ H10W 72/019 438/597
6,316,786 B1 11/2001 Mueller et al.
6,333,120 B1 12/2001 DeHaven et al.
6,333,206 B1 12/2001 Ito et al.
6,348,709 B1 2/2002 Graettinger et al.
6,374,770 B1 4/2002 Lee
6,409,904 B1 6/2002 Uzoh et al.
6,423,640 B1 7/2002 Lee et al.
6,433,402 B1 8/2002 Wo et al.
6,465,892 B1 10/2002 Suga
6,528,894 B1 3/2003 Akram et al.
6,531,384 B1 * 3/2003 Kobayashi .......... H10W 72/019 438/665
6,552,436 B2 4/2003 Burnette et al.
6,555,917 B1 4/2003 Heo
6,579,744 B1 6/2003 Jiang
6,583,515 B1 6/2003 James et al.
6,589,813 B1 7/2003 Park
6,600,224 B1 7/2003 Farquhar et al.
6,624,003 B1 9/2003 Rice
6,627,814 B1 9/2003 Stark
6,632,377 B1 10/2003 Brusic et al.
6,660,564 B2 12/2003 Brady
6,667,225 B2 12/2003 Hau-Riege et al.
6,828,686 B2 12/2004 Park
6,837,979 B2 1/2005 Uzoh et al.
6,864,585 B2 3/2005 Enquist
6,887,769 B2 5/2005 Kellar et al.
6,902,987 B1 6/2005 Tong et al.
6,908,027 B2 6/2005 Tolchinsky et al.
6,909,194 B2 6/2005 Farnworth et al.
6,962,835 B2 11/2005 Tong et al.
6,974,769 B2 12/2005 Basol et al.
7,045,453 B2 5/2006 Canaperi et al.
7,078,811 B2 7/2006 Suga
7,105,980 B2 9/2006 Abbott et al.
7,109,063 B2 9/2006 Jiang
7,126,212 B2 10/2006 Enquist et al.
7,193,423 B1 3/2007 Dalton et al.
7,238,919 B2 7/2007 Kaneko et al.
7,354,798 B2 4/2008 Pogge et al.
7,485,968 B2 2/2009 Enquist et al.
7,750,488 B2 7/2010 Patti et al.
7,803,693 B2 9/2010 Trezza
7,998,335 B2 8/2011 Feeney et al.
8,039,966 B2 10/2011 Yang et al.
8,101,858 B2 1/2012 Hannour et al.
8,168,532 B2 5/2012 Haneda et al.
8,183,127 B2 5/2012 Patti et al.
8,241,961 B2 8/2012 Kim et al.
8,242,600 B2 8/2012 Yang et al.
8,314,007 B2 11/2012 Vaufredaz
8,349,635 B1 1/2013 Gan et al.
8,377,798 B2 2/2013 Peng et al.
8,435,421 B2 5/2013 Keleher et al.
8,441,131 B2 5/2013 Ryan
8,476,146 B2 7/2013 Chen et al.
8,476,165 B2 7/2013 Trickett et al.
8,482,132 B2 7/2013 Yang et al.
8,501,537 B2 8/2013 Sadaka et al.
8,524,533 B2 9/2013 Tong et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,728,934 B2 5/2014 Uzho et al.
8,802,538 B1 8/2014 Liu
8,809,123 B2 8/2014 Liu et al.
8,841,002 B2 9/2014 Tong
8,988,299 B2 3/2015 Kam et al.
9,000,600 B2 4/2015 Uzoh et al.
9,028,755 B2 5/2015 Itoh
9,093,350 B2 7/2015 Endo et al.
9,123,703 B2 9/2015 Uzoh et al.
9,142,517 B2 9/2015 Liu et al.
9,171,756 B2 10/2015 Enquist et al.
9,184,125 B2 11/2015 Enquist et al.
9,190,345 B1 11/2015 Chen et al.
9,190,375 B2 11/2015 Ayotte et al.
9,224,704 B2 12/2015 Landru
9,230,941 B2 1/2016 Chen et al.
9,257,399 B2 2/2016 Kuang et al.
9,269,612 B2 2/2016 Chen et al.

(56) References Cited

U.S. PATENT DOCUMENTS 9,299,736 B2 3/2016 Chen et al.
9,312,229 B2 4/2016 Chen et al.
9,318,385 B2 4/2016 Uzoh et al.
9,331,149 B2 5/2016 Tong et al.
9,337,235 B2 5/2016 Chen et al.
9,343,330 B2 5/2016 Brusic et al.
9,349,669 B2 5/2016 Uzoh et al.
9,368,866 B2 6/2016 Yu
9,385,024 B2 7/2016 Tong et al.
9,391,143 B2 7/2016 Tong et al.
9,394,161 B2 7/2016 Cheng et al.
9,431,368 B2 8/2016 Enquist et al.
9,433,093 B2 8/2016 Uzoh
9,437,572 B2 9/2016 Chen et al.
9,443,796 B2 9/2016 Chou et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,633,971 B2 4/2017 Uzoh
9,656,852 B2 5/2017 Cheng et al.
9,666,573 B1 5/2017 Sukekawa
9,723,716 B2 8/2017 Meinhold
9,728,521 B2 8/2017 Tsai et al.
9,741,620 B2 8/2017 Uzoh et al.
9,776,270 B2 10/2017 Ayotte et al.
9,799,587 B2 10/2017 Fujii et al.
9,852,988 B2 12/2017 Enquist et al.
9,881,882 B2 1/2018 Hsu et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,147,641 B2 12/2018 Enquist et al.
10,204,893 B2 2/2019 Uzoh et al.
10,262,963 B2 4/2019 Enquist
10,269,756 B2 4/2019 Uzoh
10,276,619 B2 4/2019 Kao et al.
10,276,909 B2 4/2019 Huang et al.
10,314,175 B2 6/2019 Sato et al.
10,418,277 B2 9/2019 Cheng et al.
10,434,749 B2 10/2019 Tong et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,515,913 B2 12/2019 Katkar et al.
10,522,499 B2 12/2019 Enquist et al.
10,707,087 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,908,173 B2 2/2021 Yamasaki et al.
10,923,408 B2 2/2021 Huang et al.
10,923,413 B2 2/2021 DeLaCruz
10,937,755 B2 3/2021 Shah et al.
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,056,348 B2 7/2021 Theil
11,088,099 B2 8/2021 Katkar et al.
11,127,738 B2 9/2021 DeLaCruz et al.
11,158,606 B2 10/2021 Gao et al.
11,171,117 B2 11/2021 Gao et al.
11,176,450 B2 11/2021 Teig et al.
11,244,920 B2 2/2022 Uzoh
11,256,004 B2 2/2022 Haba et al.
11,264,357 B1 3/2022 DeLaCruz et al.
11,276,676 B2 3/2022 Enquist et al.
11,329,034 B2 5/2022 Tao et al.
11,348,898 B2 5/2022 DeLaCruz et al.
11,355,443 B2 6/2022 Huang et al.
11,515,279 B2 11/2022 Uzoh et al.
11,769,747 B2 9/2023 Sawada et al.
11,908,739 B2 2/2024 Uzoh
12,046,571 B2 7/2024 Uzoh et al.
12,100,676 B2 9/2024 Uzoh et al.
12,132,020 B2 10/2024 Uzoh et al.
12,154,880 B2 11/2024 Uzoh
2002/0000328 A1 1/2002 Motomura et al.
2002/0003307 A1 1/2002 Suga
2002/0025665 A1 2/2002 Juengling
2002/0074670 A1 6/2002 Suga
2003/0092220 A1 5/2003 Akram
2003/0157748 A1 8/2003 Kim et al.
2004/0084414 A1 5/2004 Sakai et al.
2004/0238492 A1 12/2004 Catabay et al.
2005/0156332 A1* 7/2005 Yamamoto .......... H10W 20/062 257/E21.583
2006/0024950 A1 2/2006 Choi et al.
2006/0057945 A1 3/2006 Hsu et al.
2006/0220197 A1 10/2006 Kobrinsky et al.
2007/0096294 A1 5/2007 Ikeda et al.
2007/0111386 A1 5/2007 Kim et al.
2008/0073795 A1 3/2008 Kohl et al.
2008/0122092 A1 5/2008 Hong
2008/0237053 A1 10/2008 Andricacos et al.
2009/0197408 A1 8/2009 Lehr et al.
2009/0200668 A1 8/2009 Yang et al.
2010/0065969 A1* 3/2010 Yu ........................ B29C 43/222 257/E23.161
2010/0255262 A1 10/2010 Chen et al.
2010/0327443 A1 12/2010 Kim
2011/0074040 A1 3/2011 Frank et al.
2011/0076787 A1 3/2011 Ahmad et al.
2011/0084403 A1 4/2011 Yang et al.
2012/0211894 A1 8/2012 Aoyagi
2012/0212384 A1 8/2012 Kam et al.
2013/0009321 A1 1/2013 Kagawa et al.
2013/0020704 A1 1/2013 Sadaka
2013/0127055 A1* 5/2013 Chen ................ H01L 21/76819 438/653
2013/0221527 A1 8/2013 Yang et al.
2013/0252399 A1 9/2013 Leduc
2013/0320556 A1 12/2013 Liu et al.
2014/0153210 A1 6/2014 Uzoh
2014/0175655 A1 6/2014 Chen et al.
2014/0191418 A1 7/2014 Cheng et al.
2014/0225258 A1* 8/2014 Chiu .................. H01L 21/6835 257/737
2014/0225795 A1 8/2014 Yu
2014/0252635 A1 9/2014 Tran et al.
2014/0264948 A1 9/2014 Chou et al.
2014/0353828 A1 12/2014 Edelstein et al.
2015/0064498 A1 3/2015 Tong
2015/0108644 A1 4/2015 Kuang et al.
2015/0206823 A1 7/2015 Lin et al.
2015/0206840 A1 7/2015 Lin et al.
2015/0279888 A1 10/2015 Chen et al.
2015/0340269 A1 11/2015 Rivoire et al.
2015/0364434 A1 12/2015 Chen et al.
2015/0380368 A1 12/2015 Momose et al.
2016/0020183 A1 1/2016 Chuang et al.
2016/0133598 A1 5/2016 Baudin et al.
2016/0276383 A1 9/2016 Chuang et al.
2016/0343682 A1 11/2016 Kawasaki

(56) References Cited

U.S. PATENT DOCUMENTS

2017/0025381 A1 1/2017 Tsai et al.
2017/0047307 A1 2/2017 Uzoh
2017/0062366 A1* 3/2017 Enquist .................. H01L 24/05
2017/0069575 A1 3/2017 Haba et al.
2017/0086320 A1 3/2017 Barber
2017/0141079 A1 5/2017 Kao et al.
2017/0162540 A1* 6/2017 Ji ........................ H10W 74/147
2017/0194271 A1 7/2017 Hsu et al.
2017/0271242 A1 9/2017 Lo et al.
2017/0330855 A1 11/2017 Tung et al.
2017/0355040 A1 12/2017 Utsumi et al.
2018/0151523 A1 5/2018 Chen et al.
2018/0175012 A1 6/2018 Wu et al.
2018/0182639 A1 6/2018 Uzoh et al.
2018/0182665 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0219038 A1 8/2018 Gambino et al.
2018/0273377 A1 9/2018 Katkar et al.
2018/0295718 A1 10/2018 Uzoh et al.
2018/0323177 A1 11/2018 Yu et al.
2018/0323227 A1 11/2018 Zhang et al.
2018/0331066 A1 11/2018 Uzoh et al.
2018/0350674 A1 12/2018 Uzoh
2019/0096741 A1 3/2019 Uzoh et al.
2019/0115277 A1 4/2019 Yu et al.
2019/0131277 A1 5/2019 Yang et al.
2019/0198407 A1 6/2019 Huang et al.
2019/0198409 A1 6/2019 Katkar et al.
2019/0244909 A1 8/2019 Chiu et al.
2019/0265411 A1 8/2019 Huang et al.
2019/0295954 A1 9/2019 Nomura et al.
2019/0319007 A1 10/2019 Uzoh et al.
2019/0333550 A1 10/2019 Fisch
2019/0348336 A1 11/2019 Katkar et al.
2019/0385935 A1 12/2019 Gao et al.
2019/0385966 A1 12/2019 Gao et al.
2020/0006280 A1 1/2020 Shah et al.
2020/0013637 A1 1/2020 Haba
2020/0013765 A1 1/2020 Fountain, Jr. et al.
2020/0035641 A1 1/2020 Fountain, Jr. et al.
2020/0075520 A1 3/2020 Gao et al.
2020/0075534 A1 3/2020 Gao et al.
2020/0075553 A1 3/2020 DeLaCruz et al.
2020/0098711 A1 3/2020 Choi et al.
2020/0126906 A1 4/2020 Uzoh et al.
2020/0194396 A1 6/2020 Uzoh
2020/0227367 A1 7/2020 Haba et al.
2020/0243380 A1 7/2020 Uzoh et al.
2020/0279821 A1 9/2020 Haba et al.
2020/0294908 A1 9/2020 Haba et al.
2020/0328162 A1 10/2020 Haba et al.
2020/0328164 A1 10/2020 DeLaCruz et al.
2020/0328165 A1 10/2020 DeLaCruz et al.
2020/0335408 A1 10/2020 Gao et al.
2020/0365575 A1 11/2020 Uzoh et al.
2020/0371154 A1 11/2020 DeLaCruz et al.
2020/0381389 A1 12/2020 Uzoh et al.
2020/0395321 A1 12/2020 Katkar et al.
2020/0411483 A1 12/2020 Uzoh et al.
2021/0028136 A1 1/2021 Said et al.
2021/0028144 A1 1/2021 Lu
2021/0098411 A1 4/2021 Liff et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 Katkar et al.
2021/0193624 A1 6/2021 DeLaCruz et al.
2021/0193625 A1 6/2021 DeLaCruz et al.
2021/0234070 A1 7/2021 Brueck et al.
2021/0242050 A1 8/2021 Chiu
2021/0242152 A1 8/2021 Fountain, Jr. et al.
2021/0257333 A1 8/2021 Yan
2021/0296282 A1 9/2021 Gao et al.
2021/0305202 A1 9/2021 Uzoh et al.
2021/0335737 A1 10/2021 Katkar et al.
2021/0366820 A1 11/2021 Uzoh
2021/0407941 A1 12/2021 Haba
2022/0077063 A1 3/2022 Haba
2022/0077087 A1 3/2022 Haba
2022/0130787 A1 4/2022 Uzoh
2022/0139867 A1 5/2022 Uzoh
2022/0139869 A1 5/2022 Gao et al.
2022/0139975 A1 5/2022 Kimura et al.
2022/0149002 A1 5/2022 Hou et al.
2022/0157752 A1 5/2022 Bourjot et al.
2022/0165692 A1 5/2022 Uzoh et al.
2022/0208650 A1 6/2022 Gao et al.
2022/0208723 A1 6/2022 Katkar et al.
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2023/0005849 A1 1/2023 Chuang
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0268300 A1 8/2023 Uzoh et al.
2023/0268307 A1 8/2023 Uzoh et al.
2023/0299029 A1 9/2023 Theil et al.
2023/0343734 A1 10/2023 Uzoh et al.
2023/0360950 A1 11/2023 Gao
2023/0361074 A1 11/2023 Uzoh et al.
2023/0369136 A1 11/2023 Uzoh et al.
2023/0375613 A1 11/2023 Haba et al.
2024/0038702 A1 2/2024 Uzoh
2024/0055407 A1 2/2024 Workman et al.
2024/0079376 A1 3/2024 Suwito et al.
2024/0105674 A1 3/2024 Uzoh et al.
2024/0113059 A1 4/2024 Uzoh et al.
2024/0170411 A1 5/2024 Chang et al.
2024/0186248 A1 6/2024 Haba et al.
2024/0186268 A1 6/2024 Uzoh et al.
2024/0186269 A1 6/2024 Haba
2024/0213191 A1 6/2024 Theil et al.
2024/0213210 A1 6/2024 Haba et al.
2024/0217210 A1 7/2024 Zhao et al.
2024/0222239 A1 7/2024 Gao et al.
2024/0222315 A1 7/2024 Uzoh
2024/0222319 A1 7/2024 Gao et al.
2024/0266255 A1 8/2024 Haba et al.
2024/0298454 A1 9/2024 Haba
2024/0304593 A1 9/2024 Uzoh
2024/0312951 A1 9/2024 Theil et al.

(56) References Cited

U.S. PATENT DOCUMENTS

| | | | |
|---|---|---|---|
| 2024/0332184 | A1 | 10/2024 | Katkar et al. |
| 2024/0332227 | A1 | 10/2024 | Uzoh et al. |
| 2024/0332231 | A1 | 10/2024 | Uzoh |
| 2024/0332267 | A1 | 10/2024 | Haba et al. |
| 2024/0387419 | A1 | 11/2024 | Mrozek et al. |
| 2025/0004197 | A1 | 1/2025 | Haba et al. |
| 2025/0006632 | A1 | 1/2025 | Chang et al. |
| 2025/0006642 | A1 | 1/2025 | Haba et al. |
| 2025/0006674 | A1 | 1/2025 | Uzoh et al. |
| 2025/0006679 | A1 | 1/2025 | Theil et al. |
| 2025/0006689 | A1 | 1/2025 | Uzoh et al. |
| 2025/0022752 | A1 | 1/2025 | Uzoh |
| 2025/0054854 | A1 | 2/2025 | Katkar et al. |
| 2025/0079364 | A1 | 3/2025 | Uzoh et al. |
| 2025/0087616 | A1 | 3/2025 | Uzoh |
| 2025/0096172 | A1 | 3/2025 | Uzoh et al. |
| 2025/0096191 | A1 | 3/2025 | Gao et al. |
| 2025/0112123 | A1 | 4/2025 | Katkar et al. |
| 2025/0185163 | A1 | 6/2025 | Zhao et al. |
| 2025/0210585 | A1 | 6/2025 | Fountain, Jr. et al. |
| 2025/0212554 | A1 | 6/2025 | Katkar et al. |
| 2025/0218903 | A1 | 7/2025 | Uzoh et al. |

FOREIGN PATENT DOCUMENTS

| | | | |
|---|---|---|---|
| CN | 106711131 | A | 5/2017 |
| CN | 107256852 | B | 9/2019 |
| JP | 2000-183061 | | 6/2000 |
| JP | 2002-353416 | A | 12/2002 |
| JP | 2013-033786 | A | 2/2013 |
| JP | 2016-21497 | A | 2/2016 |
| JP | 2018-129475 | | 8/2018 |
| JP | 2018-160519 | | 10/2018 |
| KR | 10-2008-0050129 | | 6/2008 |
| KR | 10-2016-0066272 | | 6/2016 |
| WO | WO 2005/043584 | A2 | 5/2005 |
| WO | WO 2009/021266 | A1 | 2/2009 |
| WO | WO 2022/147429 | A1 | 7/2022 |

OTHER PUBLICATIONS

Basol et al., "Electrochemical mechanical deposition (ECMDT technique for semiconductor interconnect applications," Microelectronic Engineering, 2002, vol. 64, pp. 43-51.

Basol et al., "Growth of Planarized Copper Film by ECMD Deposition Technique," ERC Retreat, Stanford University, Palo Alto, CA, Aug. 21-22, 2003 (reference not found).

Basol et al., "Planar copper plating and electropolishing techniques," Chemical Engineering Communication, Jul. 2006, 14 pages.

Basol et al., "Study on the Mechanism of Electrochemical Mechanical Deposition of Copper Layers," Nu Tool Inc., 1655 McCandless Drive, Milpitas, CA 95035, Electrochemical Processes in ULSI and MEMS, Proceedings of the International Symposium; Proceedings vol. 2004-17, pp. 155-160.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Che, F.X. et al., "Study on Cu protrusion of through-silicon via," IEEE Transactions on Components, Packaging and Manufacturing Technology, May 2013, vol. 3, No. 5, pp. 732-739.

Dela Pena, Eden M. et al., "Electrodeposited copper using direct and pulse currents from|electrolytes containing low concentration of additives," School of Chemical and Process Engineering, University of Strathclyde, 2018 Surface and Coating Technology, 40 pages.

De Messemaeker, Joke et al., "Correlation between Cu microstructure and TSV Cu pumping," 2014 Electronic Components & Technology Conference, pp. 613-619.

Di Cioccio, L. et al., "An overview of patterned metal/dielectric surface bonding: Mechanism, alignment and characterization," Journal of The Electrochemical Society, 2011, vol. 158, No. 6, pp. P81-P86.

Ganesan, Kousik, "Capable copper electrodeposition process for integrated circuit—substrate packaging manufacturing," A dissertation presented in partial fulfillment of the requirements for the degree Doctor of Philosophy, Arizona State University, May 2018, 320 pages.

Gondcharton, P. et al., "Kinetics of low temperature direct copper-copper bonding," Microsyst Technol, 2015, vol. 21, pp. 995-1001.

Heryanto, A. et al., "Effect of copper TSV annealing on via protrusion for TSV wafer fabrication," Journal of Electronic Materials, 2012, vol. 41, No. 9, pp. 2533-2542.

Hobbs, Anthony et al., "Evolution of grain and micro-void structure in electroplated copper interconnects," Materials Transactions, 2002, vol. 43, No. 7, pp. 1629-1632.

Huang, Q., "Effects of impurity elements on isothermal grain growth of electroplated copper," Journal of The Electrochemical Society, 2018, vol. 165, No. 7, pp. D251-D257.

Huang, Q., "Impurities in the electroplated sub-50 nm Cu lines: The effects of the plating additives," Journal of The Electrochemical Society, 2014, vol. 161, No. 9, pp. D388-D394.

International Search Report and Written Opinion for PCT/US2018/022379, dated Jun. 29, 2018.

Jiang, T. et al., "Plasticity mechanism for copper extrusion in through-silicon vias for three-dimensional interconnects," Applied Physics Letters, 2013, vol. 103, pp. 211906-1-211906- 5.

Juang, Jing-Ye et al., "Copper-to-copper direct bonding on highly (111)-oriented nanotwinned copper in No. vacuum ambient," Scientific Reports, Sep. 17, 2018, vol. 8, 11 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Khan, Muhammed et al., "Damascene Process and Chemical Mechanical Planarization," http://www.ece.umd.edu/class/enee416/GroupActivities/Damascene%20Presentation.pdf, 25 pages.

Kim, Myung Jun et al., "Characteristics of pulse-reverse electrodeposited Cu thin film," I. Effects of Anodic Step in the Absence of an Organic Additives, Journal of The Electrochemical Society, 2012, vol. 159, No. 9, pp. D538-D543.

Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.

Liu, C. et al., "Low-temperature direct copper-to-copper bonding enabled by creep on (111) surfaces of nanotwinned Cu," Scientific Reports, May 12, 2015, 5:09734, pp. 1-11.

Liu, Chien-Min et al., "Effect of grain orientations of Cu seed layers on the growth of <111>-oriented nanotwinned Cu," Scientific Reports, 2014, vol. 4, No. 6123, 4 pages.

Liu, Zi-Yu et al. "Detection and formation mechanism of micro-defects in ultrafine pitch Cu—Cu direct bonding," Chin. Phys. B, 2016, vol. 25, No. 1, pp. 018103-1-018103-7.

Lu, L. et al., "Grain growth and strain release in nanocrystalline copper," Journal of Applied Physics, vol. 89, Issue 11, pp. 6408.

Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.

Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.

Moriceau, H. et al., "Overview of recent direct wafer bonding advances and applications," Adv Nat Sciences: Nanoscience and Nanotechnology, Dec. 2010;1(4):043004; 11 pages.

Morrison, Jim et al., "Samsung Galaxy S7 Edge Teardown," Tech Insights (posted Apr. 24, 2016), includes description of hybrid

(56) References Cited

OTHER PUBLICATIONS bonded Sony IMX260 dual-pixel sensor, https://www.techinsights.com/blog/samsung-galaxy-s7-edge-teardown, downloaded Jul. 11, 2023, 9 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412.
Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820.".
Ortleb, Thomas et al., "Controlling macro and micro surface topography for a 45nm copper CMP process using a high resolution profiler," Proc. Of SPIE, 2008, vol. 6922, 11 pages.
Parthasaradhy, N.V., "Practical Electroplating Handbook," 1989, Prentice-Hall, Inc., pp. 54-56.
Plössl, A. et al., "Wafer direct bonding: tailoring adhesion between brittle materials," Materials Science and Engineering: R: Reports. Mar. 10, 1999;25(1-2):1-88.
Saraswat, Stanford Presentation, Cu Interconnect slides, web page web.stanford.edu/class/ee311/NOTES/Cu_Interconnect_Slides.pdf, 19 pages.
Song, Xiaohui, "Atomic study of copper-copper bonding using nanoparticles," Journal of Electronic Packaging, Jun. 2020, vol. 142, 5 pages.
Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no|representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Swingle, Karen D., "Nanograin Copper Deposition Using an Impinging Jet Electrode," A Thesis submitted in partial satisfaction of the requirements of the degree of Master of Science, University of California, San Diego, 2013, 102 pages.
Takahashi, K. et al., "Transport phenomena that control electroplated copper filling of submicron vias and trenches," Journal of The Electrochemical Society, 1999, vol. 146, No. 12, pp. 4499-4503.
Zheng, Z. et al., "Study of grain size effect of Cu metallization on interfacial microstructures of solder joints," Microelectronics Reliability, 2019, vol. 99, pp. 44-51.
Roy, A. et al., "Annealing effects on the surface properties of Cu—TiC thin films," Materials Today: Proceedings, 2021, vol. 44, Part 1, pp. 170-175.
Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).
Zik, N. et al., "Thermally produced nano catalyst for biodiesel production: A review," Journal of Advanced Research in Fluid Mechanics and Thermal Sciences, 2018, vol. 52, Issue 2, pp. 139-147.
Berla et al., "A Model for Power Law Creep Controlled Hillock Growth". Materials Science and Engineering: A. Aug. 15, 2008;488(1-2): 594-600.
Chen et al., "Wafer Level Bonding Using Localized Radio-Frequency Induction Heating". Science China Technological Sciences. May 2010;53: 1252-1257.
Chiu et al., "Low-Temperature Wafer-to-Wafer Hybrid Bonding by Nanocrystalline Copper". In 2022 IEEE 72nd Electronic Components and Technology Conference (ECTC) May 31, 2022 (pp. 679-684).
Classone Technologies, "Copper RDL Plating"—Using the Solstice® CopperMax™ Reactor, downloaded from https://classone.com/electroplating/copper-rdl-plating/ on Sep. 11, 2024; 3 pages.
Das et al., "Theory of welding of metallic parts in microwave cavity applicator," Fundamental J. Modern Physics. 2012;3(2): 125-155.
Diehm et al., "Low temperature processing of highly integrated assemblies by selective microwave heating". 2006 1st Electronic Systemintegration Technology Conference, Dresden, Germany, 2006, pp. 608-611, doi: 10.1109/ESTC.2006.280066.
Ericson et al., A transmission electron microscopy study of hillocks in Thin Aluminum Films. J Vac Sci Technol. B: Jan. 1, 1991;9(1): 58-63.
Hofmann et al., "Localized Induction Heating of Cu—Sn Layers for Rapid Solid-Liquid Interdiffusion Bonding Based on Miniaturized Coils," Micromachines. Aug. 12, 2022;13(8): 1307 in 24 pages.
Hu et al., "Two-Step Ar/N2 Plasma-Activated Al Surface for Al—Al Direct Bonding". In 2022 IEEE 72nd Electronic Components and Technology Conference (ECTC) May 31, 2022 (pp. 324-329); doi: 10.1109/ECTC51906.2022.00060.
Hwang et al., "A Model for Hillock Growth in Al Thin Films Controlled by Plastic Deformation," Acta Materialia. Sep. 1, 2007;55(15): 5297-5301.
Hwang et al., "Effect of Film Thickness and Annealing Temperature on Hillock Distributions in Pure Al Films," Scripta materialia. Jan. 1, 2007;56(1): 17-20.
Iwamura et al., "Effect of Aluminum Oxide Caps on Hillock Formation in Aluminum Allow Films," Thin Solid Films. Jul. 30, 1999;349(1-2): 191-198.
Mori E., "Suppression of Byproduct Accumulation in Rechargeable Aluminum-Air Batteries Using Non-Oxide Ceramic Materials as Air Cathode Materials". Sustainable Energy & Fuels. 2017;1(5): 1082-1089.
Rebhan et al., "Low-Temperature Aluminum-Aluminum Wafer Bonding". ECS Transactions. Aug. 24, 2016;75(9): 15; 10 pages.
Santoro C.J., "Thermal Cycling and Surface Reconstruction in Aluminum Thin Films". Journal of the Electrochemical Society. Mar. 1, 1969;116(3):361-364.

* cited by examiner 600
(A)
308
104
(B)
308
104
(C)
304
602
(D)
304
306
104
308
(E)
310
306
304
302
308
104
(F)
306
304
308
302
104
(G)
306
304
308
302
104

MULTI-METAL CONTACT STRUCTURE IN MICROELECTRONIC ASSEMBLY

PRIORITY CLAIM AND CROSS-REFERENCE TO RELATED APPLICATION

This application is a continuation of and claims priority to U.S. patent application Ser. No. 17/370,576, filed Jul. 8, 2021, now U.S. Pat. No. 11,894,326, which is a divisional of U.S. patent application Ser. No. 16/700,802, filed Dec. 2, 2019, now U.S. Pat. No. 11,088,099, which is a continuation of U.S. patent application Ser. No. 15/919,894, filed Mar. 13, 2018, now U.S. Pat. No. 10,515,913, and also claims the benefit under 35 U.S.C. § 119(e)(1) of U.S. Provisional Application No. 62/472,877, filed Mar. 17, 2017, entitled "MULTI-METAL CONTACT STRUCTURE," all of which are hereby incorporated by reference in their entirety.

FIELD

The following description relates to processing of integrated circuits ("ICs"). More particularly, the following description relates to devices and techniques for processing substrates.

BACKGROUND

Semiconductor chips are fabricated on suitable flat substrate wafers, such as GaAs, diamond coated substrates, silicon carbide, silicon wafers, etc. After making the active devices, a series of steps are performed to connect the various devices with highly conducting wiring structures, so they can have communication with each other to perform logic or memory storage operations. These wiring structures or interconnect structures are essentially a skeletal network of conducting materials, typically metals, in a matrix of dielectric materials. In high performance devices and to improve device density and yield, it may be desirable to minimize topographic features within the interconnect layers for any given device and across the entire substrate. One common method of forming these high performance interconnect layers is the damascene process.

Multiple types of damascene structures are known, however single and dual damascene processes are the most common. In single damascene, each metal or via layer is fabricated in a series of operations, while in dual damascene, a metal layer and a via layer may be fabricated in a similar operation. Of these two, the dual damascene technique may be preferred because of lower cost and higher device performance.

In the single damascene process, a suitable substrate with or without devices is coated with a suitable resist layer. The resist layer is imaged to define desirable patterns by lithographic methods on the substrate. Cavities are etched on the patterned substrates typically by reactive ion etching (RIE) methods. The etched cavities are cleaned to remove RIE residues. The patterned substrate is then coated with a suitable barrier/seed layer prior to overfilling the cavities with a suitable metal, typically copper, by electro-deposition from a superfilling plating bath chemistry.

The damascene process may be repeated to form multiple layers of interconnects, and the top surface of the substrate is polished. As a result of the discontinuity in the properties (difference in mechanical properties, polishing rates, etc.) of the metal and insulator, and their respective interactions with the polishing pad, polishing slurry, and other process parameters, the polishing produces erosion in high metal pattern density features and dishing in large metal structures. The higher the metal pattern density, the higher the erosion in the dielectric layer. Similarly, the larger the size of the metal cavity, the worse the gravity of the dishing defect. These deleterious defects can cause a variety of defects in subsequent layers, reducing device yield.

Similar results are observed in cross section topographic profiles of polished through silicon via (TSV) structures. The centers of the vias are typically lower than the surface of the insulators.

Among the consequences of dishing on the interconnect structures is poor flatness of the conductor and much higher temperatures typically needed to bond devices to the dished substrate or for wafer to wafer bonding using so called hybrid bonding, i.e. DBI® techniques. With very large pads, dishing can be too deep for the opposing device's surfaces to mate intimately and to form a grain contact or inter-diffusion bond, as the metal may not expand enough at annealing temperatures to form the diffusion bond. Also, the poor flatness on the conductor surface often produces defective bonds, when the surface is bonded or attached to other devices or substrates.

Attempts to reduce the impact of these defects have included the incorporation of dummy dielectric features within large copper structures in dual damascene features for chip interconnects. This can effectively reduce the dishing in copper pads, since the metal width is significantly reduced as compared to previous large pads without dummy dielectric features within them. This approach has been helpful, but it has also increased mask design complexity and the associated loss of freedom of structure placement on the modified pads.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

SUMMARY

Figures 1A, 1B:
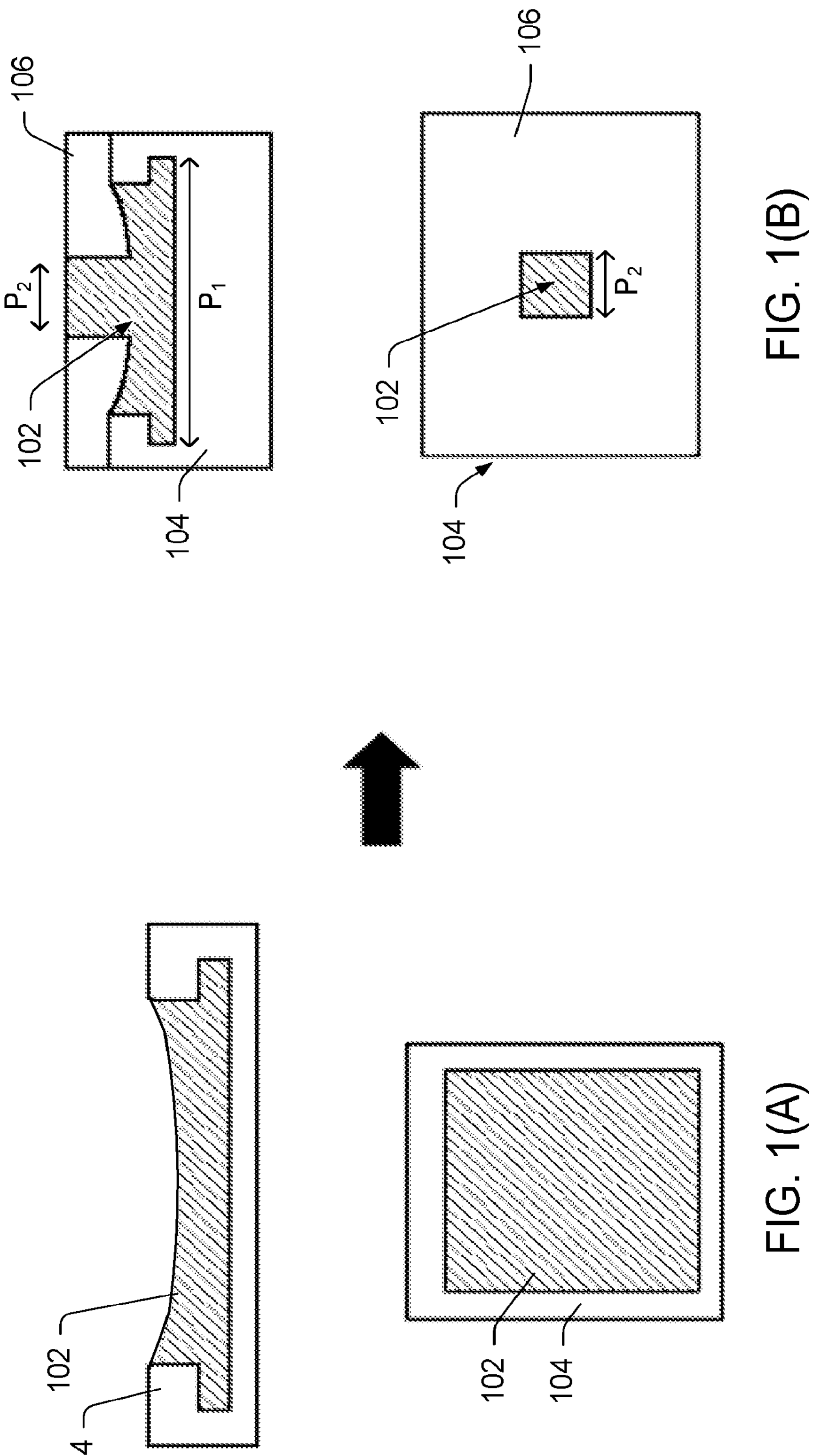
FIG. 1(A) shows a profile view and a plan view of dishing of a large contact pad as a result of example substrate processing.
FIG. 1(B) shows a profile view and a plan view of a polished plated substrate with added conforming dielectric layer(s) used to reduce dishing of the contact area.

Various embodiments of techniques and devices for improving the conductivity of contact pads and associated devices, are disclosed. The embodiments comprise techniques to remedy the erosion or "dishing" of contact pads on substrates resulting from chemical mechanical polishing/planarizing (CMP) of the substrates, as well as improving the conductivity of the remedied contact pads on the substrates.

A microelectronic component can include a substrate including a recess or opening extending from a first surface of the substrate, at least a portion of the first surface of the substrate having a planarized topography. A first conductive material, having a first hardness, may be disposed within the recess or opening in a first preselected pattern and may form a first portion of an interconnect structure of the microelectronic component, the first portion of the interconnect structure extending normal to a plane of the substrate. Additionally, a second conductive material, having a second hardness different from the first hardness, may be disposed within the recess or opening in a second preselected pattern and may form a second portion of the interconnect structure of the microelectronic component, the second portion of the interconnect structure extending normal to the plane of the substrate.

In a first embodiment, a layer of the first conductive material may be disposed over an exposed surface of the second portion of the interconnect structure. Additionally, a layer of a third conductive material, different from the first and second conductive materials, may be disposed over an exposed surface of the first and second portions of the interconnect structure. Further, the first conductive material may comprise copper or a copper alloy and the second conductive material may comprise nickel or a nickel alloy. Still yet, the first conductive material or the second conductive material may comprise at least one of copper, nickel, tin, indium, gallium, or gold, or an alloy of at least one of copper, nickel, tin, indium, gallium, or gold.

In a second embodiment, a conductive layer may be disposed at a preselected depth below the first surface of the substrate and extending parallel to the plane of the substrate, the first portion of the interconnect structure and the second portion of the interconnect structure formed on a first surface of the conductive layer. Further, one or more additional conductive materials having one or more additional hardness characteristics different from the first hardness and the second hardness, may be disposed within the recess or opening in one or more preselected patterns and forming one or more additional portions of the interconnect structure of the microelectronic component. Still yet, the first portion of the interconnect structure and the second portion of the interconnect structure may be adjacent vertical layers, extending normal to the plane of the substrate.

In a third embodiment, the second hardness of the second conductive material may be greater than the first hardness of the first conductive material.

In a fourth embodiment, an exposed surface of the second portion of the interconnect structure may protrude above an exposed surface of the first portion of the interconnect structure and may be level with or recessed below the first surface of the substrate.

In a fifth embodiment, a coefficient of thermal expansion (CTE) of the first conductive material may be greater than a CTE of the second conductive material.

In a sixth embodiment, the first preselected pattern may comprise a grid pattern and the second preselected pattern may comprise a fill between portions of the grid pattern. Additionally, the first preselected pattern and the second preselected patterns may comprise alternating concentric rings. Further, the second preselected pattern may comprise a first elliptical or polygonal shape and the first preselected pattern may comprise a plurality of smaller elliptical or polygonal shapes, the plurality of smaller elliptical or polygonal shapes arranged within a perimeter of the first elliptical or polygonal shape.

A microelectronic component can include a substrate including a recess or opening extending from a first surface of the substrate, at least a portion of the first surface of the substrate having a planarized topography. A first material, having a first hardness, may be disposed within the recess or opening in a grid pattern and may form a first portion of an interconnect structure of the microelectronic component, the first portion of the interconnect structure extending normal to a plane of the substrate. Additionally, a second material, having a second hardness different from the first hardness, may be disposed within the recess or opening in a pattern comprising a fill between portions of the grid pattern and may form a second portion of the interconnect structure of the microelectronic component, the second portion of the interconnect structure extending normal to the plane of the substrate, wherein one of the first and second materials may comprise a conductive material and the other of the first and second materials comprises a non-conductive material or dielectric.

A microelectronic component can include a substrate including a recess or opening extending from a first surface of the substrate, at least a portion of the first surface of the substrate having a planarized topography. A first material, having a first hardness, may be disposed within the recess or opening in a first pattern and may form a first portion of an interconnect structure of the microelectronic component, the first portion of the interconnect structure extending normal to a plane of the substrate. Additionally, a second material, having a second hardness different from the first hardness, may be disposed within the recess or opening in a second pattern and may form a second portion of the interconnect structure of the microelectronic component, the second portion of the interconnect structure extending normal to the plane of the substrate, wherein one of the first and second materials may comprise a conductive material and the other of the first and second materials may comprise a non-conductive material or dielectric and wherein the first and second patterns may comprise alternating concentric rings.

A method of forming a microelectronic component can include forming a recessed portion in a first surface of a substrate, the recessed portion extending a preselected depth below the first surface of the substrate. A first conductive material may be disposed having a first hardness within the recessed portion in a first preselected pattern to form a first portion of an interconnect structure of the microelectronic component, the first portion of the interconnect structure extending normal to a plane of the substrate. Additionally, a second conductive material may be disposed having a second hardness different than the first hardness within the recessed portion in a second preselected pattern to form a second portion of the interconnect structure of the microelectronic component, the second portion of the interconnect structure extending normal to the plane of the substrate. Further, the first surface of the substrate may be planarized for intimate surface bonding, the planarizing forming an exposed surface of the first portion of the interconnect structure recessed below the first surface of the substrate and may form an exposed surface of the second portion of the interconnect structure protruding above the exposed surface of the first portion of the interconnect structure and level with or recessed below the first surface of the substrate.

In a seventh embodiment, a layer of the first conductive material may be deposited over the exposed surface of the second portion of the interconnect structure. Additionally, the first interconnect structure and the second interconnect structure comprise one of an electrical contact pad or a via in pad. Further, the first portion of the interconnect structure or the second portion of the interconnect structure may be formed of a reflowable metal material. The first portion of the interconnect structure and the second portion of the interconnect structure may additionally be formed as adjacent vertical layers, extending normal to the plane of the substrate.

In an eighth embodiment, the microelectronic component may be a first microelectronic component and the interconnect structure may be a first interconnect structure, and a surface of a second microelectronic component may be contacted to the first surface of the first microelectronic component to bond the second microelectronic component to the first microelectronic component without an adhesive layer, and a second interconnect structure of the second microelectronic component may be bonded to the first interconnect structure by a metal to metal diffusion bond without an intervening reflowable material.

In a ninth embodiment, a conductive layer may be formed within the recessed portion of the substrate at the preselected depth below the first surface of the substrate and extending parallel to the plane of the substrate, and the first portion of the interconnect structure and the second portion of the interconnect structure may be formed on a first surface of the conductive layer.

A microelectronic component can include a substrate including a recess or opening extending from a first surface of the substrate, at least a portion of the first surface of the substrate having a planarized topography. A first conductive material, having a first melting point, may be disposed within the recess or opening in a first preselected pattern and may form a first portion of an interconnect structure of the microelectronic component, the first portion of the interconnect structure extending normal to a plane of the substrate. Additionally, a second conductive material, having a second melting point greater than the first melting point, may be disposed within the recess or opening in a second preselected pattern and may form a second portion of the interconnect structure of the microelectronic component, the second portion of the interconnect structure extending normal to the plane of the substrate and may have an exposed surface of the second portion of the interconnect structure protruding above the exposed surface of the first portion of the interconnect structure and level with or recessed below the first surface of the substrate.

In a tenth embodiment, one or more additional conductive materials having one or more additional and different melting points may be disposed within the recess or opening in one or more preselected patterns and forming one or more additional portions of the interconnect structure of the microelectronic component.

A microelectronic component can include a substrate including a recess or opening extending from a first surface of the substrate, at least a portion of the first surface of the substrate having a planarized topography. A first conductive material, having a first melting point, may be disposed within the recess or opening at a conducting layer of the substrate and may form a first portion of an interconnect structure of the microelectronic component, the first portion of the interconnect structure extending normal to a plane of the substrate and having a thickness greater than one micrometer. Additionally, a second conductive material having a second melting point different than the first melting point, may be disposed within the recess or opening at the conducting layer of the substrate and may form a second portion of the interconnect structure of the microelectronic component, the second portion of the interconnect structure extending normal to the plane of the substrate and having a thickness greater than one micrometer.

A microelectronic component can include a substrate including a recess or opening extending from a first surface of the substrate, at least a portion of the first surface of the substrate having a planarized topography. A first conductive material, having a first hardness, may be disposed within the recess or opening in a first preselected pattern and may form a first portion of an interconnect structure of the microelectronic component, the first portion of the interconnect structure extending normal to a plane of the substrate. Additionally, a second non-conductive material, having a second hardness different from the first hardness, may be disposed within the recessed portion in a second preselected pattern and may form a second portion of the interconnect structure of the microelectronic component, the second portion of the interconnect structure extending normal to the plane of the substrate. Further, the second preselected pattern may comprise a first elliptical or polygonal shape and the first preselected pattern may comprise a plurality of smaller elliptical or polygonal shapes, the plurality of smaller elliptical or polygonal shapes arranged within a perimeter of the first elliptical or polygonal shape.

The disclosed processes can be implemented in any suitable manufacturing or processing apparatus or system, along with any hardware, software, firmware, or a combination thereof, without departing from the scope of the subject matter described herein. Implementations are explained in more detail below using a plurality of examples. Although various implementations and examples are discussed here and below, further implementations and examples may be possible by combining the features and elements of individual implementations and examples.

DETAILED DESCRIPTION

Overview

Various embodiments of techniques and devices for improving the conductivity of contact pads and associated devices, are disclosed. The embodiments comprise techniques to remedy the erosion or "dishing" of contact pads on substrates resulting from chemical mechanical polishing/planarizing (CMP) of the substrates, as well as improving the conductivity of the remedied contact pads on the substrates.

FIG. 1 (A) shows a profile view and a plan view of dishing of a large contact pad as a result of example substrate processing. As shown, a cross-section of a large metallic (copper, for example) contact pad 102 is disposed within a substrate 104 (which may comprise a dielectric or other insulating or semiconductor layer, for example), as part of a microelectronic device, for instance. The contact pad 102 shows significant dishing as a result of processing the substrate 104, such as CMP polishing, for example. In one example, a contact pad 102 could be as large as 10 to 60 micro meters wide (diameter if a circular pad or side if a square pad; other shapes may also be possible). The substrate 104 may include wafers, such as GaAs, diamond coated substrates, silicon carbide, silicon oxide, Silicon Nitride, silicon wafers, Lithium Niobate, Lithium Tantalate, flat panels, glasses, ceramics, circuit boards, packages, an interposer, structures with or without an embedded device or devices, etc. For clarity, the substrate 104 comprises a surface of interest processed for intimate contact with another surface.

As shown in FIG. 1 (A), as a result of chemical mechanical planarization (CMP), or the like, the contact pad 102 (which may be metallic) may be generally dished or recessed with respect to the substrate 104, due to the mechanical, chemical, or physical properties of the conductive metal of the contact pad 102 being different from those of the surrounding substrate 104 (which may be silicon oxide, diamond, silicon nitride or silicon oxynitide or alumina for example). In some cases, the dishing effect can be greater when the polishing compound includes metals and/or various chemicals that can remove the metal of the contact pad 102 faster than the substrate 104. Additionally, in one embodiment, the size of the recess or dishing effect may be directly proportional to the polishing pressure (i.e. the higher the pressure, the greater recess) and/or the lateral dimensions of the contact pad. In some cases, the depth of the recess in the contact pad 102 may range between 10-150 nm or up to 1-2 microns, or more. This is well beyond the range that may be generally desirable for direct bond interconnects (DBI) and other bonding methods that use intimate surface contact, especially where the interconnect features are thinner than 1 micron.

As shown in FIG. 1 (B), one technique to attempt to resolve problems generated by the excessive dishing shown at FIG. 1 (A) includes forming an added dielectric layer 106 (which may comprise one or more dielectric (or other material) layers) over the substrate 104 and some or all of the contact pad 102. When the dielectric layer 106 is planarized (using known methods, for example), the resulting exposed portion of the contact pad 102 can have a lateral dimension $P_2$ that is smaller than a lateral dimension $P_1$ of the contact pad 102 beneath.

The smaller lateral dimension $P_2$ of the exposed portion of the contact pad 102 can result in a more acceptable recess profile for direct bonding applications. For example, the smaller exposed contact pad 102 may result in reduced dishing during the CMP process, and the planarized surface of the added dielectric 106 comprises the new bonding surface.

This approach can be helpful to reduce dishing, but it can also increase mask design complexity and the associated loss of freedom of structure placement on the modified contact pads. Further, the exposed area of the modified contact pad (indicated by $P_2$) is a fraction of the area of the original pad (indicated by $P_1$), greatly reducing the electrical contact area and increasing the resistance of the contact area of the pad 102. The smaller contact pad 102 reduces the electrical current carrying capacity of the contact pad 102, which is not always desirable.

FIG. 2 (A) shows a profile view and a plan view dishing of a large contact pad as a result of example substrate processing. As shown, a large contact pad 102 (which may be metallic) is disposed within a substrate 104 (which may be a dielectric), as described with reference to FIG. 1 (A). As described above, the contact pad 102 shows significant dishing as a result of processing the substrate 104, such as CMP polishing, for example.

FIG. 2 (B) illustrates another remedy sometimes used to minimize dishing of the contact area. As shown at FIG. 2 (B), to avoid severe dishing, the metal-to-oxide density can be reduced at the contact area using a metallic grid 202. For example, the metallic grid 202 can have a similar area dimension as the large contact pad 102, and can be used in place of the contact pad 102. The metallic grid 202 can comprise a copper mesh, for example, the perimeter of which approximates the perimeter of the contact pad 102. The metallic grid 202 can be continuous with or coupled to other interconnect structures, wiring features, vias, or the like, to provide electrical connectivity for a microelectronic device, or the like.

The metallic grid 202 may be formed, for example, by etching trenches in the substrate 104, and filling the trenches (using deposition, a damascene process, or the like) with copper or other conductive materials. Since the traces of the metallic grid 202 can have a minimal width (e.g., 1-10 um, for example), the dishing of the contact area can be greatly reduced (down to about 2-10 nm, for instance). This process may result in a more even bonding surface, which is advantageous for bonding using intimate surface contact techniques.

However, the metallic grid 202 can significantly reduce the electrical contact area and increase the resistance of the contact area. For example, while the overall area within the contact pad may be approximately 25 um×25 um (625 $um^2$), the effective area of the grid available for contact may be much smaller, on the order of 184 $um^2$ (8×[1 um×25 um]−16 $um^2$) for the trench thickness of 1 um and the effective contact area when 2 such pads are bonded together using a DBI method may be even smaller, on the order of 18 $um^2$ or lower, due to the offset between the contact pads. The reduction in electrical contact, the effective increase in contact resistance and resulting loss of performance of the contact area can make this a less than ideal solution.

Figures 2A, 2B, 2C:
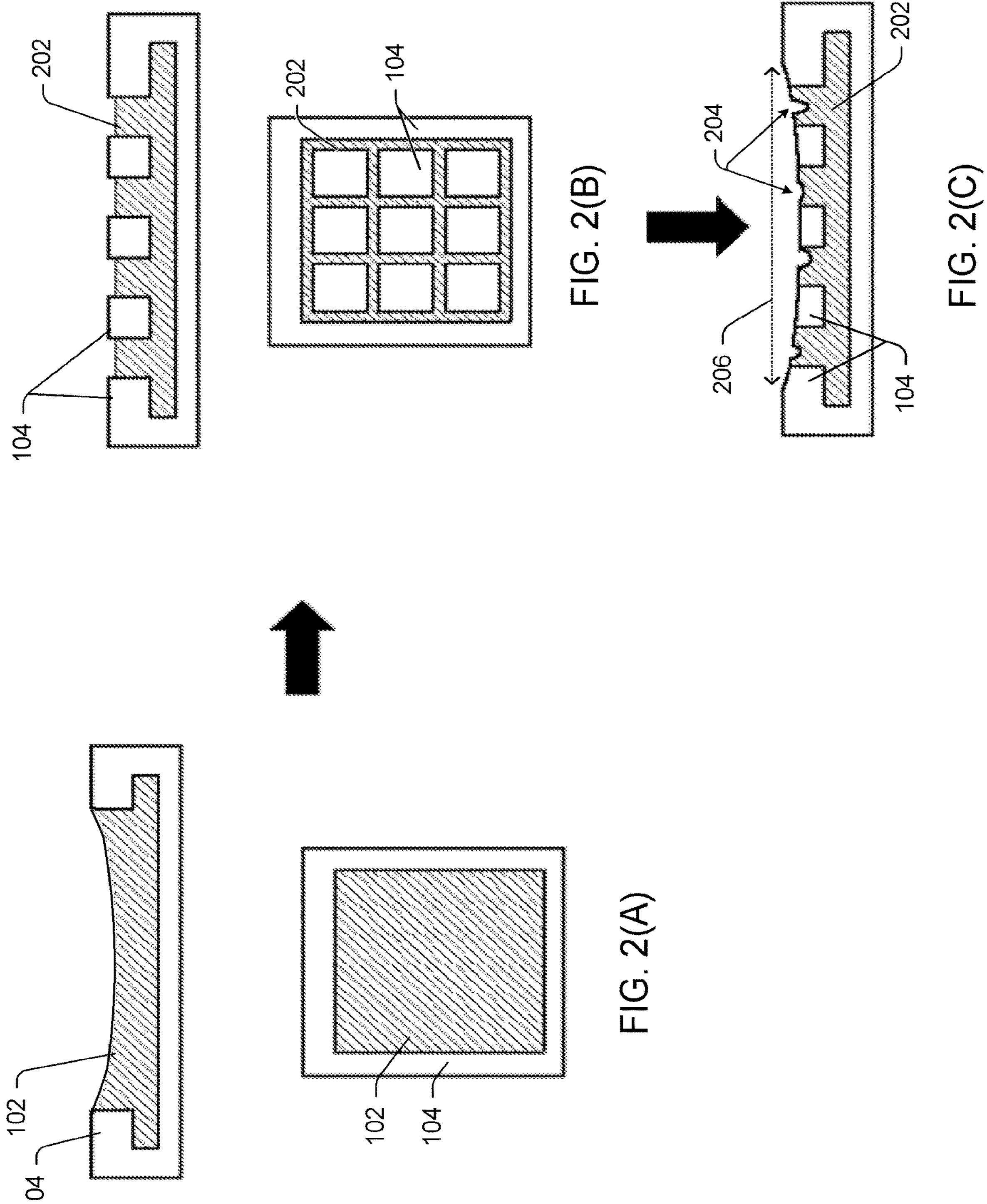
FIG. 2(A) shows a profile view and a plan view of dishing of a large contact pad as a result of example substrate processing.
FIG. 2(B) shows a profile view and a plan view of a substrate with an embedded metallic grid used to reduce dishing of a contact area.
FIG. 2(C) shows a profile view of dishing of substrate with an embedded metallic grid.

Also, the substrate 104 (which may be a silicon oxide region, a dielectric material, or the like) between adjacent metallic traces within the grid 202 can experience erosion. The erosion of the substrate 104 may even be more severe than the dishing of the metallic grid 202 in some instances. For example, the erosion of the substrate 104 may range between 10 to 25 nm or even greater, while the dishing in the metallic grid 202 may still be within specification. In such instances, the large erosion of the substrate 104 now controls the higher bonding temperature used for the metallic grid 202 to expand to contact the opposing mating device. Further, excessive substrate 104 erosion can produce voids in portions of the structures, where the opposing surfaces cannot mate intimately. FIG. 2(C) shows a profile view of dishing of substrate 104 with an embedded metallic grid 202. As shown at FIG. 2 (C), after polishing the substrate 104 and the metallic grid 202, dishing 204 and dielectric erosion 206 may result.

Example Embodiments

Figure 3B:
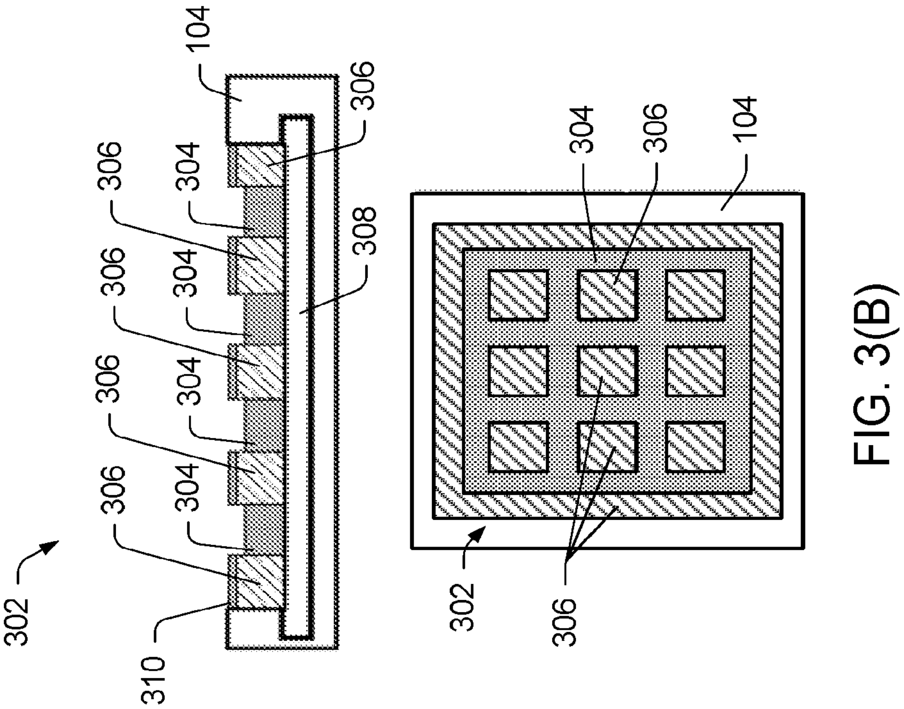
FIG. 3(B) shows a profile view and a plan view of a substrate with an example multi-metal contact area, according to an embodiment.
Figure 3A:
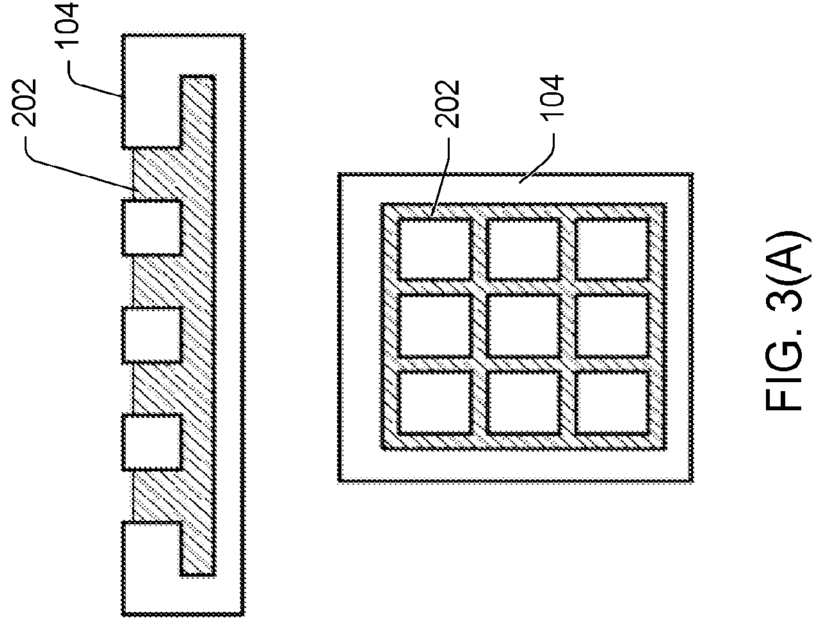
FIG. 3(A) shows a profile view and a plan view of the substrate with embedded metallic grid of FIG. 2(B).

FIG. 3 shows a comparison of the metallic grid 202 (shown at FIG. 3 (A) in cross-section and plan views) with a novel multi-metal contact structure 302, according to one embodiment. In various embodiments, the multi-metal structure 302 (shown at FIG. 3 (B), also in cross-section and plan views) can be used in place of the metallic grid 202 or the contact pad 102 to reduce dishing of the contact area, without the issue of erosion of the substrate 104 between the traces of the grid 202. For instance, as shown in FIG. 3 (B), the multi-metal contact structure 302 can be comprised of two or more conductive materials, such as metals for example. A first conductive material can be used to form the mesh 304, similar to the metallic grid 202. For example, the first conductive material may comprise copper, a copper alloy, or the like. The first conductive material may be softer than the surrounding substrate, and so may be susceptible to some dishing during polishing. Accordingly, the width of the mesh 304 traces can be kept to a minimum (1-5 um, for example) to reduce dishing, but may be greater than the metallic grid 202 in some cases.

Instead of a dielectric fill between portions of the mesh, the areas between portions of the mesh 304 of the multi-metal structure 302 can be filled with a second conductive material. The second conductive material of the fill 306 can be harder than the first conductive material of the mesh 304, to reduce the dishing of the contact area. For example, the second conductive material may comprise nickel, a nickel alloy, or the like. In various implementations, different pairs of metals (such as copper and tin, for example) can be used to form the mesh 304 and fill 306, where the softer of the metals may be used for the mesh 304. Alternately, a third conductive material (or more) can be used to form part of the mesh 304 and/or portions of the fill 306, as desired for hardness, conductivity, coefficient of thermal expansion (CTE), and the like. In another case, the second conductive material of the fill 306 can be softer (e.g. Cu) than the first conductive material of the mesh 304 (e.g. Ni). This can also reduce the dishing of the contact area.

The fill 306 may be formed by removing one or more portions of the substrate 104 (which may be oxide) surrounding and/or between the portions of the mesh 304. The second conductive material may be deposited in the vacated areas where the oxide was removed. In alternate embodiments, not all of the oxide surrounding and/or in between the mesh 304 may be removed, and the fill 306 may be formed with other patterns than those illustrated. In other words, in alternate embodiments, the fill 306 may comprise portions of one or more conductive materials and portions of dielectric.

The use of multiple conductive materials (metals, for example) to form the multi-metal structure 302 increases the overall performance of the contact area, by increasing the electrically conductive area of contact and reducing the resistance. Dishing may also be reduced with the multi-metal structure 302 (to about 2-10 nm) as compared to the large conductive contact pad 102 (>10-60 nm). One of the conductive materials can be selected to have a lower CTE, as compared to the CTE of the other conductive material, to allow the first conductive material to expand more under thermal conditions during bonding.

As discussed further below, the multi-metal structure 302 may be formed on a conductive layer 308, which may be coupled to or continuous with other interconnect structures, wiring features, vias, or the like, to provide electrical connectivity for a microelectronic device, or the like, having the multi-metal structure 302. To enhance bonding of the multi-metal structure 302 to another contact area, the fill 306 comprising the second conductive material (or another conductive material) can be flashed (as shown at 310) with the first conductive material (copper, for instance), or the like. This allows the diffusion bonding based on a lower annealing temperature for the first conductive material to be operative on both portions of the multi-metal structure 302.

Figures 4A, 4B, 4C:
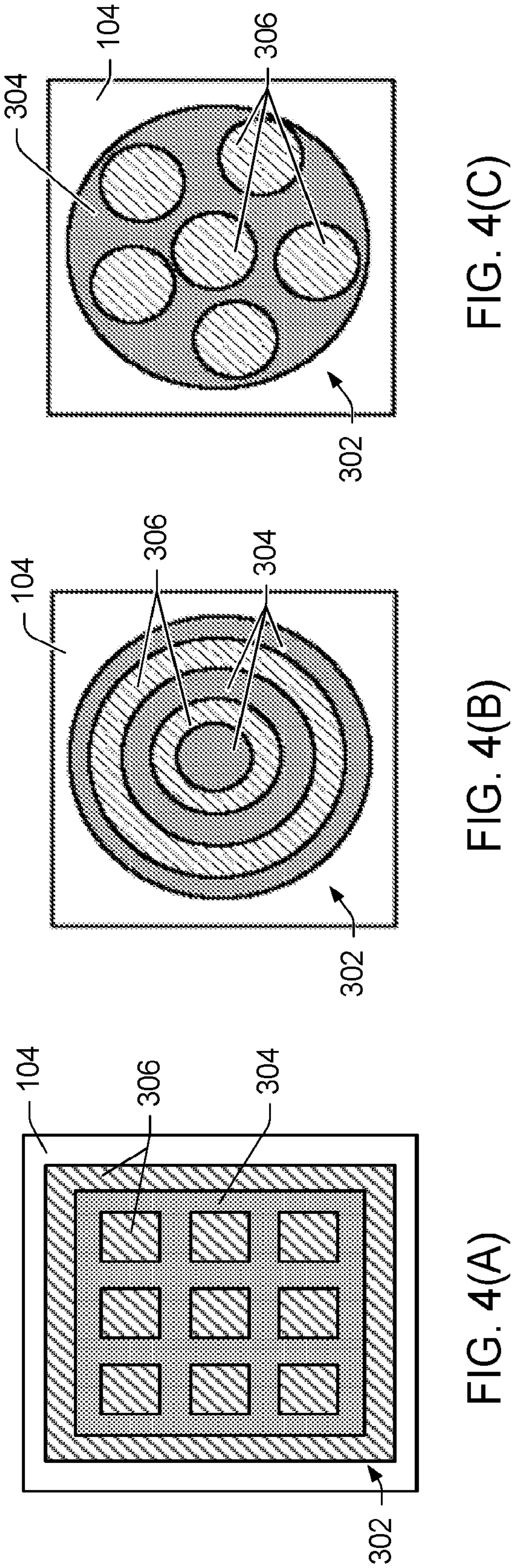
FIG. 4(A) shows a plan view of a substrate with an example multi-metal contact area according to a first embodiment.
FIG. 4(B) shows a plan view of a substrate with an example multi-metal contact area according to a second embodiment.
FIG. 4(C) shows a plan view of a substrate with an example multi-metal contact area according to a third embodiment.

Three example embodiments of a multi-metal structure 302 are illustrated at FIG. 4. The example embodiments include two or more different conductive materials to reduce dishing and improve conductivity of the contact area. In alternate embodiments, a multi-metal structure 302 can have various other shapes, patterns, quantities of different materials, and so forth, and remain within the scope of the disclosure.

The multi-metal structure 302 at FIG. 4 (A) represents a first embodiment having the rectangular grid pattern as discussed above, with reference to FIG. 3 (B). At FIG. 4 (B), a second embodiment is illustrated with an overall elliptical shape. The multi-metal structure 302 includes alternating rings of alternating conductive materials, representing the mesh 304 and fill 306 portions. The negative effects of sharp corners on the multi-metal structure 302 may be avoided using an elliptical cross-sectional shape. The positive aspects of reduced dishing and improved conductivity due to increased conductive contact area may be present with the embodiment in addition to the reduction in adverse effects on electrical performance due to elimination of sharp corners. In some embodiments (not shown), a mesh 304 (and associated fill 306) with polygonal patterns or other patterns can be formed within the overall elliptical shape of FIG. 4 (B).

At FIG. 4 (C), a third embodiment is illustrated with an overall elliptical shape as well, with the stated advantages. The multi-metal structure 302 includes mesh 304 of the first conductive material within the surrounding fill 306. In various implementations, the mesh 304 may have an elliptical shape (as shown) or they may have polygonal or other shapes and/or sizes. This embodiment also provides reduced dishing and improved conductivity due to the increased conductive contact area of the multi-metal structure 302. The depth of dishing may be altered by changing the area of one or more of the mesh 304. Of course, it is to be appreciated that mesh 304 and surrounding fill 306 may be of any formation, size, and/or shape.

Figure 5:
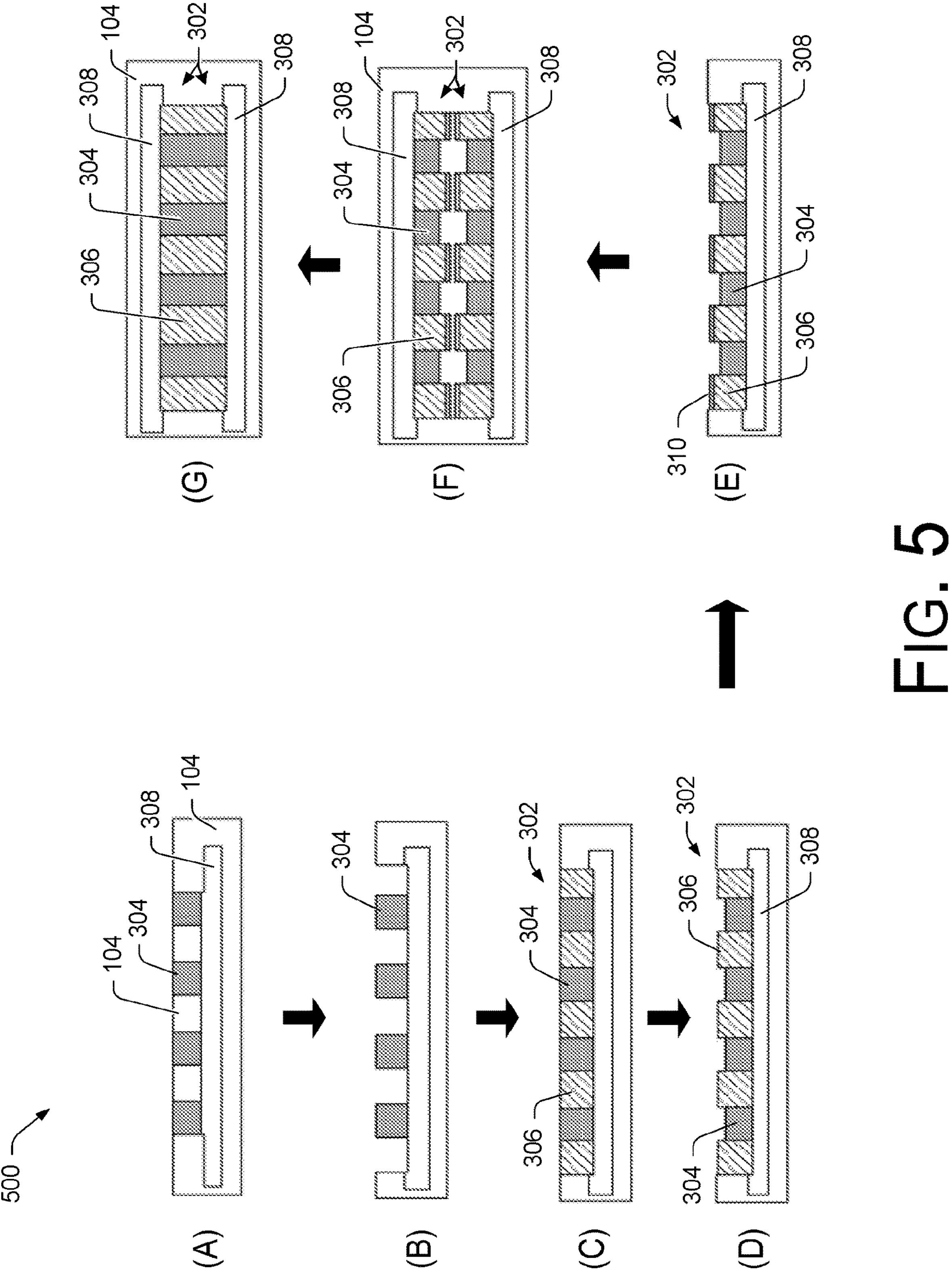
FIG. 5 illustrates an example process of forming and bonding two substrates with multi-metal contact areas, according to an embodiment.

FIG. 5 illustrates an example process 500 of forming a contact area of the multi-metal structure 302, and bonding two substrates with contact areas comprising the multi-metal structure 302, according to an embodiment. At (A), a first conductive material (copper, for example) may be formed in a desired pattern (such as a mesh 304, for example) on a surface of the substrate 104. The pattern of the first conductive material may be formed by removing a portion of the substrate 104 (by etching, for example), and depositing the first conductive material in the vacancies created (via a damascene process, or other deposition). If the substrate 104 comprises silicon oxide, for example, adhesion layers comprising titanium, tantalum, chromium, or the like, may be deposited before depositing the first conductive material. The first conductive material may be conductively coupled to the conductive layer 308, which may comprise copper, aluminum, or the like, and may be continuous with other contact areas of the device. In one embodiment, nickel, a nickel alloy, or other conductive material may be used in place of copper as the first conductive material.

At (B), remaining portions of the substrate 104 surface around the conductive pattern (e.g., mesh 304) may be removed. Alternately, some of the dielectric material of the substrate 104 surface may be allowed to remain, to form a desired pattern. At (C), the second conductive material (nickel, for example) may be deposited in the vacancies of the substrate 104 surface, forming the fill 306. Alternately, a third (or more) conductive material may be deposited to form the mesh 304 or the fill 306. The combination of the mesh 304 and the fill 306 forms the multi-metal structure 302, which includes an electrical contact structure comprising a pattern of vertical layers of two or more conductive materials, extending normal to the plane of the substrate 104, as shown.

At (D), the surface of the device (substrate 104 and multi-metal structure 302) may be polished, using a CMP process, or the like. As a result of the polishing, some dishing may occur on the exposed surface of the conductive materials (minimal dishing, 2-10 nm, due to the pattern of the multi-metal structure 302), with a greater dishing occurring on the mesh 304 than the fill 306, due to the difference in hardness of the materials.

At (E), a flash 310 (via electro-less plating, for example) of the first conductive material (e.g., copper) may be applied to the exposed surface of the fill 306 areas to facilitate bonding. For instance, the flashed metal allows the fill 306 areas to bond at the same annealing temperature as the mesh 304 areas. At (F), the device may be bonded to another device using a ZIBOND® technique, or the like, wherein the dielectric portions of the substrate 104 are bonded to dielectric portions of the other device. In an example, as shown in FIG. 5, the other device may be a device with a multi-metal structure 302.

At (G), the multi-metal structure 302 may be bonded to the other multi-metal structure 302, using annealing, or the like, such as a direct bond interconnect (DBI) technique, i.e. directly bonding or diffusion bonding the surfaces of the multi-metal structures 302 without an intervening reflowable material, such as solder. For example, the DBI technique may use predetermined heat to bond the multi-metal structures 302. During annealing, the copper flashing on the fill 306 allows the second conductive material (e.g., nickel) to bond at the same temperature as the first conductive material (e.g., copper). The coefficient of thermal expansion (CTE) of the nickel (for example) of the fill 306 may be less than the CTE of the copper (or tin, for instance) of the mesh 304, allowing the copper to expand more than the nickel, and to fill the gaps in the metal to metal bond. In some embodiments the flash layer 310 coated over the multi-metal structure 302 may be comprised of tin, indium, gallium, gold, or the like, or their respective alloys and combinations thereof. In some applications, the melting point of the flash layer 310 may be similar or lower than the melting point of the first or second conductive materials of the mesh 304 or fill 306 respectively. In some applications, a reflowable metal like tin may also be used as mesh 304 or fill 306.

Figure 6:
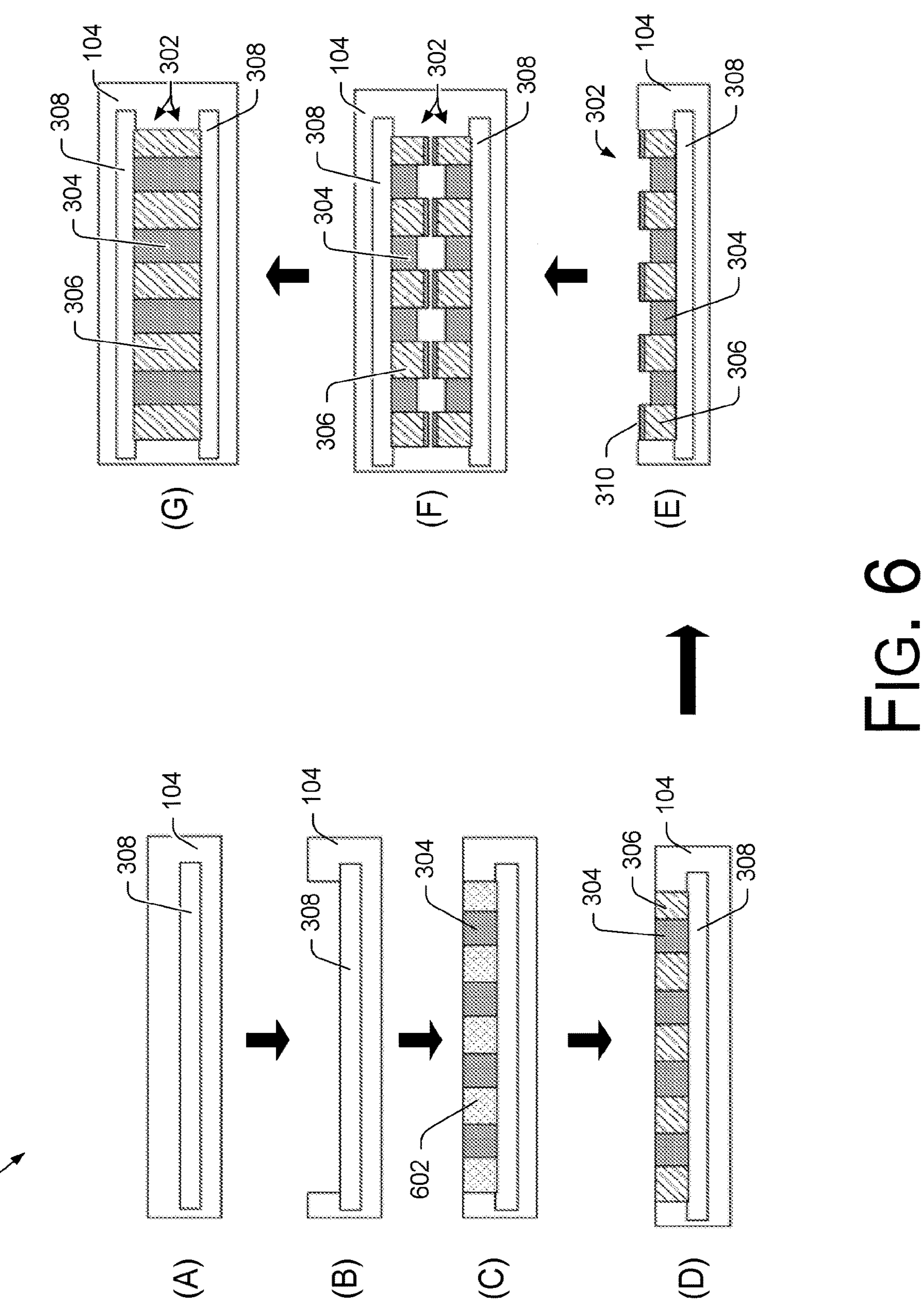
FIG. 6 illustrates another example process of forming and bonding two substrates with multi-metal contact areas, according to an embodiment.

FIG. 6 illustrates another example process 600 of forming a contact area of the multi-metal structure 302, and bonding two substrates with contact areas of the multi-metal structure 302, according to an embodiment. At (A), a conductive layer 308 may be formed within a dielectric (or the like) substrate 104. At (B), a portion of the oxide substrate may be removed to reveal the conductive layer 308. At (C), resist 602 may be applied to the conductive layer 308, developed and patterned. The first conductive metal (e.g., copper) may be deposited in cavities formed by the resist 602, the cavities forming a preselected pattern (such as mesh 304, for example) on a surface of the conductive layer 308. The first conductive material may be conductively coupled to the conductive layer 308, which may comprise copper, aluminum, or the like, and may be continuous with other contact areas of the device. The mesh 304 extends from the conductive layer 308 normal to the plane of the substrate 104.

At (D), the process includes removing the resist 602, and depositing the second conductive material. The second conductive material (nickel, for example) may be deposited in the vacancies of the removed resist 602, forming the fill 306. This may be followed by polishing (by CMP, for example) which can result in some minimal dishing of the first and second conductive materials. Alternately, a third (or more) conductive material may be deposited to form the mesh 304 or the fill 306. The combination of the mesh 304 and the fill 306 forms the multi-metal structure 302, which includes an electrical contact area comprising a pattern of vertical layers of two or more conductive materials, extending normal to the plane of the substrate 104, as shown. Still in other embodiments, after forming the conductive layer 304 by thru-mask plating methods, the resist layer 602 may be stripped to expose the top surface of conductive layer 308; a new patterned resist (not shown) may be formed over the conductive layer 308 to selectively form the second conductor fill 306. The second resist may be stripped and a planarizing or non-planarizing layer may be coated over the plated structures mesh 304 and fill 306 prior to a CMP operation.

At (E), CMP may be performed on the multi-metal structure 302 and a flash 310 (via electro-less plating, for example) of the first conductive material (e.g., copper) may be applied to the exposed surface of the fill 306 areas to facilitate bonding. For instance, the flashed metal allows the fill 306 areas to bond at the same annealing temperature as the mesh 304 areas. At (F), the device may be bonded to another device using a ZIBOND® technique, or the like, wherein the dielectric portions of the substrate 104 are bonded to dielectric portions of the other device. In an example, as shown in FIG. 6F, the other device may be a device with a multi-metal structure 302.

At (G), the multi-metal structure 302 may be bonded to the other multi-metal structure 302, using annealing, or the like, such as a direct bond interconnect (DBI) technique, i.e. directly bonding the surfaces of the multi-metal structures 302 without an intervening reflowable material, such as solder. For example, the DBI technique may use pressure and/or heat to bond the multi-metal structures 302. During annealing, the copper flashing 310 on the fill 306 allows the second conductive material (e.g., nickel) to bond at the same temperature as the first conductive material (e.g., copper). The coefficient of thermal expansion (CTE) of the nickel of the fill 306 may be less than the CTE of the copper (or tin, for instance) of the mesh 304, allowing the copper to expand more than the nickel, and filling the gaps in the metal to metal bond. In some embodiments the flash layer 310 coated over the multi-metal structure 302 may be comprised of tin, indium, gallium, gold or their respective alloys and combinations thereof. In some applications, the melting point of the flash layer 310 may be similar or lower than the melting point of the first or second conductive materials of mesh 304 or fill 306 respectively. In some applications, a reflowable metal like tin may also be used as mesh 304 or fill 306.

Figure 7:
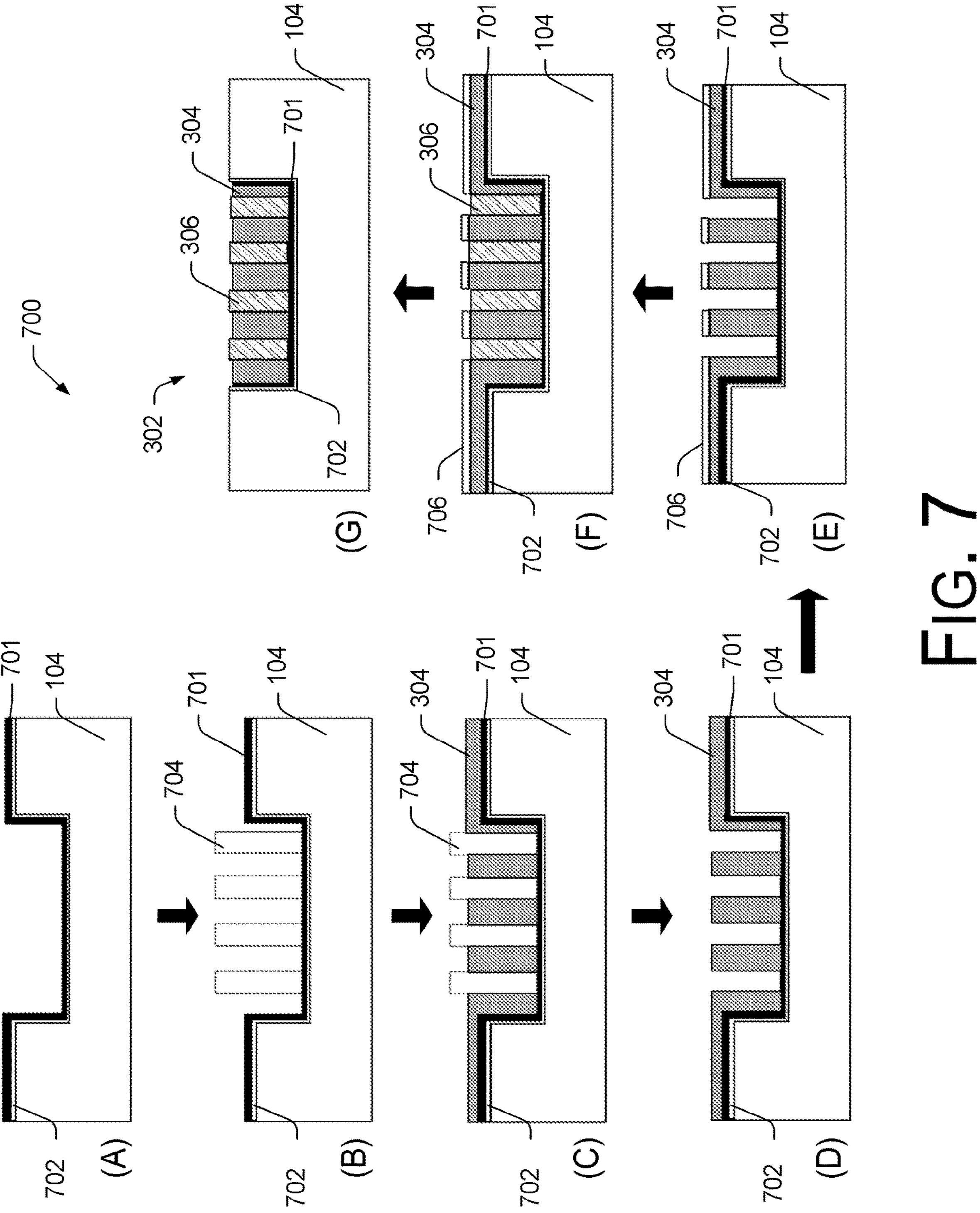
FIG. 7 illustrates another examples process of forming and bonding two substrates with multi-metal contact areas, according to an embodiment.

FIG. 7 illustrates another examples process 700 of forming and bonding two substrates 104 with multi-metal contact areas, according to an embodiment. In one embodiment, the process 700 may relate to forming a multi-metal contact structure 302, or the like. At (A), a barrier layer 702 may be applied over the substrate 104 comprising one or more cavities (such as damascene cavities). Additionally, a seed layer 701 may be applied on the surface of the barrier 702. At (B), a first resist layer 704 (which may be patterned) may be formed over portions of the seed layer 701.

At (C), the mesh 304 (for example a conductive layer, such as copper) may be deposited over portions of the seed layer 701 not protected by the resist layer 704. In one embodiment, the mesh 304 may be deposited using thru-mask plating, electrolytic, electroless, or another known method. At (D), the first resist layer 704 may be removed from the surface of the seed layer 701.

At (E), a second resist layer 706 (which may be patterned) may be formed over mesh 304. At (F), fill 306 may be selectively formed on the exposed seed layer 701 and sidewalls of the mesh 304. At (G), the mesh 304 and fill 306 are planarized (for example, by using CMP methods).

In one embodiment, a planarized substrate 104 may be prepared and bonded to another substrate. Additionally, a layer (which may be very thin) of a third (or more) conductive material (for example, a metal such as copper, copper alloy, etc.) may be selectively coated over the mesh 304 and fill 306.

In one example, the third conductive material (not shown) may be the same material as the mesh 304. In another embodiment, the third conductive material may be dissimilar from the mesh 304 and the fill 306. For example, the third conductive material may comprise silver, tin, indium, gallium, and/or a combination of the foregoing materials. In one embodiment, a melting point of the third conductive material may be similar or lower than the melting point of the mesh 304 or fill 306. Additionally, the melting of the third conductive material may be lower than a melting point of one or more conductive materials beneath mesh 304 and/or fill 306.

In one embodiment, a multi-metal structure 302 may be bonded to another multi-metal structure 302 (or any number of multi metal structures 302), using annealing, or the like (such as a direct bond interconnect (DBI) technique). In this manner, the surfaces of the multi-metal structures 302 may be directly bonded without an intervening adhesive layer.

As an example, the DBI technique may use a predetermined heat to bond such multi-metal structures 302. During annealing, a third layer flashing (not shown) on the mesh 304 and/or fill 306 may allow for an additional conductive material (e.g., nickel) to bond at the same temperature as either of the mesh 304 or fill 306. In such an embodiment, the coefficient of thermal expansion (CTE) of nickel (for example of potentially fill 306) may be less than the CTE of the copper or tin (for example of potentially mesh 304), thereby allowing the copper to expand more than the nickel, and filling the gaps in the metal to metal bond. In some embodiments, the third conductive material may be distinguishable from the material used for the mesh 304 and/or fill 306 in the bonded structures or substrates.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

The invention claimed is:

1. A microelectronic component comprising:

a substrate having a planarized surface;

an interconnect structure disposed in the substrate and exposed at the planarized surface; and wherein the interconnect structure comprises a plurality of first portions and a second portion, the plurality of first portions comprising a first conductive material having a first hardness, the second portion comprising a second conductive material having a second hardness different from the first hardness, the plurality of first portions disposed in a pattern extending normal to a plane of the substrate, the second portion at least partially surrounding or surrounded by one or more of the plurality of first portions, and wherein the second portion contacts the plurality of first portions without an intervening insulating material between the second portion and the plurality of first portions and without an insulating material between the plurality of first portions.

2. The microelectronic component of claim 1, wherein the second hardness is greater than the first hardness.

3. The microelectronic component of claim 1, wherein the first conductive material has a first melting point and the second conductive material has a second melting point different from the first melting point.

4. The microelectronic component of claim 3, wherein the second melting point is greater than the first melting point.

5. The microelectronic component of claim 1, wherein a coefficient of thermal expansion (CTE) of the first conductive material is greater than a CTE of the second conductive material.

6. The microelectronic component of claim 1, further comprising a layer of the first conductive material disposed over an exposed surface of the second portion of the interconnect structure.

7. The microelectronic component of claim 1, further comprising a layer of a third conductive material different from the first and second conductive materials disposed over an exposed surface of the first and second portions of the interconnect structure.

8. The microelectronic component of claim 1, wherein the second portion of the interconnect structure is disposed in a mesh pattern and the plurality of first portions of the interconnect structure is disposed to fill between or surrounding the mesh pattern.

9. The microelectronic component of claim 8, wherein the mesh pattern has elliptical or polygonal shape.

10. The microelectronic component of claim 1, wherein the first conductive material comprises copper or a copper alloy and the second conductive material comprises nickel or a nickel alloy.

11. The microelectronic component of claim 1, wherein an exposed surface of the second portion protrudes above an exposed surface of the plurality of first portions, and the exposed surface of the second portion is level with or recessed below the planarized surface of the substrate.

12. A microelectronic assembly, comprising:

a first microelectronic component comprising:

a first substrate having a first planarized surface, a first interconnect structure disposed in the first substrate and exposed at the first planarized surface, wherein the first interconnect structure comprises a plurality of first portions disposed in a pattern extending normal to a plane of the first substrate and a second portion at least partially surrounding or surrounded by one or more of the plurality of first portions, the plurality of first portions having a first hardness, the second portion having a second hardness different from the first hardness, and wherein the second portion contacts the plurality of first portions without an intervening insulating material between the second portion and the plurality of first portions and without an insulating material between the plurality of first portions;

a second microelectronic component having a second planarized surface, and a second interconnect structure disposed in the second substrate exposed at the second planarized surface; and wherein the first substrate is directly bonded to the second substrate, and the first interconnect structure is directly bonded to the second interconnect structure.

13. The microelectronic assembly of claim 12, wherein the second hardness is greater than the first hardness.

14. The microelectronic component of claim 12, wherein the plurality of first portions has a first melting point and the second portion has a second melting point different from the first melting point.

15. The microelectronic component of claim 14, wherein the second melting point is greater than the first melting point.

16. The microelectronic component of claim 14, wherein the plurality of first portions or the second portion comprises at least one of copper, nickel, tin, indium, gallium, or gold, or an alloy thereof.

* * * * *